United States Patent [19]
Oh

[11] Patent Number: 5,877,652
[45] Date of Patent: Mar. 2, 1999

[54] VOLTAGE DETECTING CIRCUIT AND METHOD FOR REDUCED POWER CONSUMPTION

[75] Inventor: Seung-cheol Oh, Suwon, Rep. of Korea

[73] Assignee: Samsung Electronics, Co., Ltd., Suwon, Rep. of Korea

[21] Appl. No.: 852,105

[22] Filed: May 9, 1997

[30] Foreign Application Priority Data

Sep. 13, 1996 [KR] Rep. of Korea .................. 1996/39854

[51] Int. Cl.⁶ ....................................................... G05F 1/10
[52] U.S. Cl. ........................... 327/546; 327/545; 327/81; 327/143
[58] Field of Search ..................................... 327/545, 546, 327/327, 328, 313, 77, 80, 81, 143, 198

[56] References Cited

U.S. PATENT DOCUMENTS

5,448,199  9/1995  Park .......................................... 327/546
5,557,232  9/1996  Shimogawa ............................. 327/545
5,565,807  10/1996  Ward ........................................ 327/545

*Primary Examiner*—Toan Tran
*Attorney, Agent, or Firm*—Marger, Johnson, McCollom, P.C.

[57] ABSTRACT

A voltage detecting circuit and method in a synchronous DRAM is disclosed. The circuit includes first and second pull-up switching portion, first and second pull-down switching portion, first and second pull-up portion, first and second pull-down portion, ; switching transistor and a driving portion. The pull-up and pull-down switching portion are selectively turned-on according to a mode control signal, and the current paths are different for the active power down mode and the normal mode. Each pull-up portion includes a plurality of NMOS transistors connected in series and gated by the boosted voltage and each pull-down portion includes a plurality of NMOS transistors connected in series. An effective channel length of the current path selected in case of the active power down mode is longer than that selected in case of the normal operation mode. Accordingly, the resistance of the pull-up portion and the pull-down portion in the active power down mode increases to thereby reduce the current flow and power consumption.

15 Claims, 5 Drawing Sheets

VOLTAGE DETECTING CIRCUIT AND METHOD FOR REDUCED POWER CONSUMPTION

BACKGROUND OF THE INVENTION

The present invention relates to a voltage detecting circuit, and more particularly, to a circuit for detecting a level of a programming voltage VPP in an active power down mode of a semiconductor memory device.

A synchronous dynamic random access memory (SDRAM) has various operation modes. One operation mode is an active power down mode for reducing power consumption which requires the reduction of current consumed in a chip.

Figure 1:
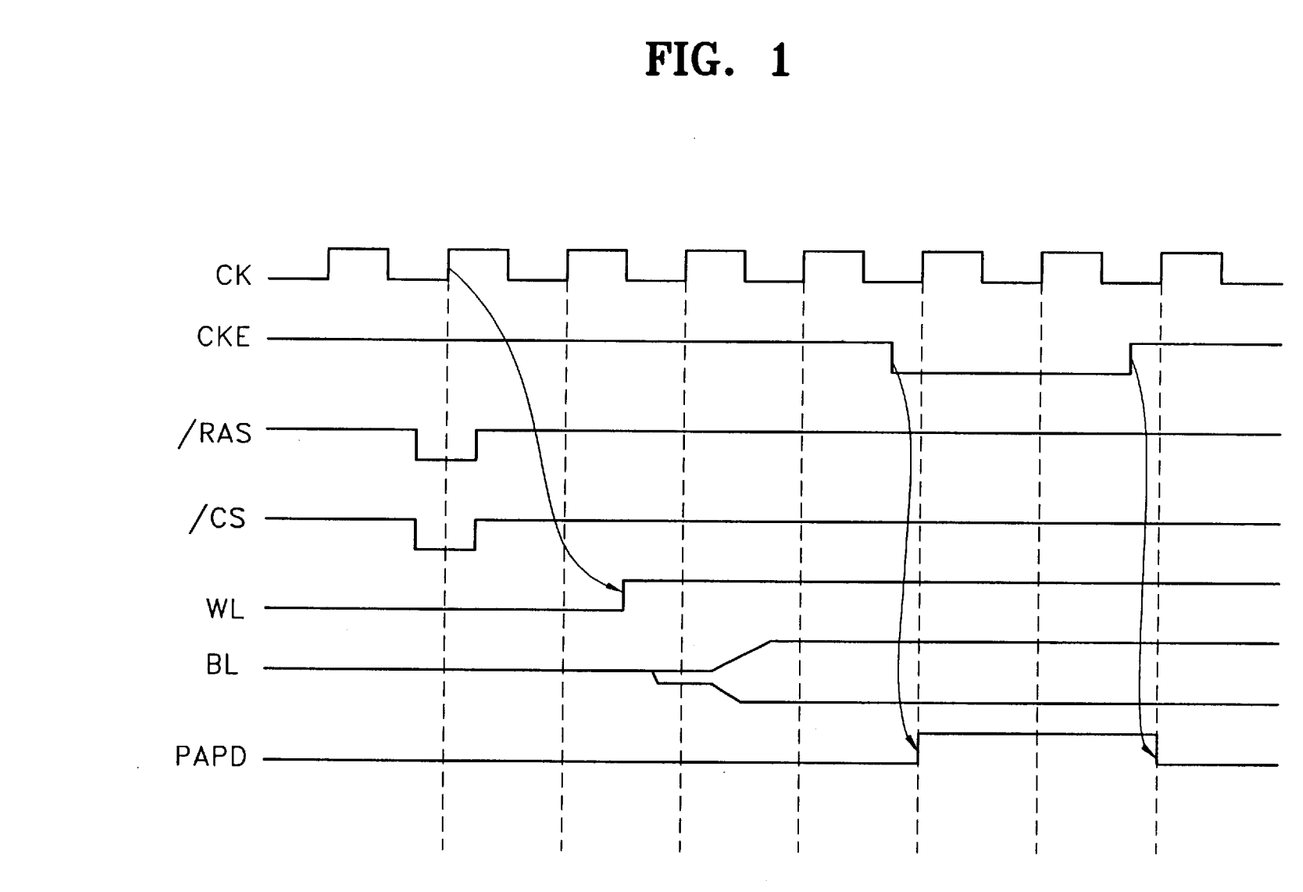
FIG. 1 is a timing diagram of each signal in an active power down mode of a semiconductor DRAM device.

FIG. 1 is a timing diagram of the signals in an active power down mode, where CK represents a system clock and CKE represents a clock enable signal. When CKE is "High", and thus active, normal memory operations are performed. However, when CKE is "Low," even though the CK is applied from the outside, the clock is not propagated in the semiconductor chip. As a result, normal memory operations cannot be performed.

When the semiconductor memory chip is set to the active power down mode, in which most of operations of the chip are halted, the current consumption in the semiconductor chip is primarily due to internal DC power driving circuits. Among these internal circuits is a circuit for detecting a programming voltage VPP which is typically at a higher voltage level than that of the external power supply VCC. /RAS and /CS represent a row address strobe signal and a chip selection signal, respectively, which are externally applied to the chip. WL and BL represent a wordline and a bitline, respectively, and PAPD represents a mode control signal based on the clock enable signal (CKE).

Figure 2:
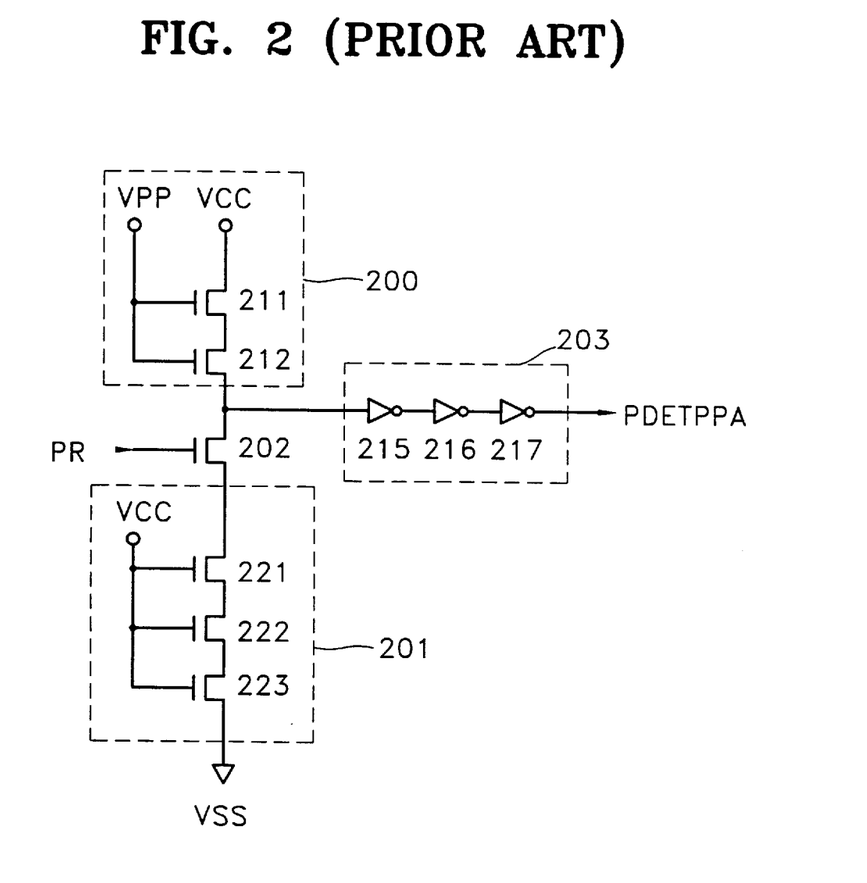
FIG. 2 is a conventional voltage detecting circuit.

FIG. 2 is a conventional voltage detecting circuit, which includes a pull-up portion 200, a pull-down portion 201, a switching transistor 202 and a driving portion 203. The pull-up portion 200 includes 2 NMOS transistors 211 and 212 gated by the boosted programming voltage VPP. The pull-down portion 201 includes NMOS transistors 221, 222 and 223 gated by power supply voltage VCC. The driving portion 203 includes inverters 215, 216 and 217. PR, which is a signal based on the /RAS signal, is applied to a gate of the switching transistor 202. Consequently, when the PR signal is "High," the switching transistor 202 is turned-on and the logic state of the driving portion 203 varies according to the level of the boosted voltage VPP applied to the gates of NMOS transistors 211 and 212 of pull-up portion 200. However, this conventional voltage detecting circuit has a single current path regardless of the operation mode of the semiconductor memory chip. High levels of current are required to obtain rapid operation of the voltage detecting circuit during normal operation. As a result, the circuit consumes an unnecessarily large amount of power during active power down mode.

SUMMARY OF THE INVENTION

Accordingly, it is an object of the present invention to provide a voltage detecting circuit which can operate at reduced power consumption levels during an active power down mode of a semiconductor memory chip.

It is another object of the present invention to provide a voltage detecting circuit with an effective resistance which is higher during the active power down mode than during normal operation mode.

It is still another object of the present invention to provide a voltage detecting circuit with high operating speed during the normal operation mode.

An embodiment of a voltage detecting circuit according to the present invention includes a first detection circuit portion for performing a detection operation of a voltage level which is activated in a normal operation mode, and a second detection circuit portion for performing the detection operation of the voltage level and being activated in an active power down mode, wherein an effective channel length of the second detection circuit portion is longer than that of the first detection circuit portion.

Another embodiment of a voltage detecting circuit according to the present invention includes an output terminal for producing a detection signal, a first pull-up switching portion switched-on in a normal operation mode, a second pull-up switching portion switched-on in an active power down mode, a third pull-up portion coupled between said first pull-up switching portion and said output terminal and responsive to a voltage level to be detected, a fourth pull-up portion coupled between said second pull-up switching portion and said third pull-up portion and responsive to a voltage level to be detected, a first pull-down switching portion switched-on in the normal operation mode, a second pull-down switching portion switched-on in the active power down mode, a third pull-down portion coupled to said output terminal through said first pull-down switching portion, a fourth pull-down portion coupled between said second pull-down switching portion said third pull-down portion, wherein an effective channel length of the active power down mode is longer than that of the normal operation mode.

Yet another embodiment of a voltage detecting circuit according to the present invention, having a normal operation mode and an active power down mode, includes a first power supply terminal configured to receive a first power supply voltage, a second power supply terminal configured to receive a second power supply voltage, a programming voltage terminal configured to receive a programming voltage, a mode control terminal configured to receive a mode control signal, a program ready terminal configured to receive a program ready signal, and an output terminal configured to output a voltage detect signal. The voltage detecting circuit also includes a switching transistor wherein the control terminal of the switching transistor is coupled to the program ready terminal and wherein the first power terminal of the switching transistor is coupled to the output terminal, a first pull-up switching circuit wherein the first power terminal of the first pull-up switching circuit is coupled to the first power supply terminal and wherein the control terminal of the first pull-up switching circuit is coupled to the mode control terminal, the first pull-up switching circuit being configured to conduct current between the first and second power terminals of the first pull-up switching circuit responsive to a first logic state of the mode control signal corresponding to the normal operation mode. The voltage detecting circuit also includes a second pull-up switching circuit wherein the first power terminal of the second pull-up switching circuit is coupled to the first power supply terminal and wherein the first power terminal of the second pull-up switching circuit is coupled to the mode control terminal, the second pull-up switching circuit being configured to conduct current between the first and second power terminals of the second pull-up switching circuit responsive to a second logic state of the mode control signal corresponding to the active power down mode. The voltage detecting circuit also contains a third pull-up switching circuit wherein the first power terminal of the third pull-up switching circuit is coupled to the second power terminal of the first pull-up switching circuit, and wherein the control terminal of the third pull-up switching circuit is coupled to the programming voltage terminal, and further wherein the second power terminal of the third pull-up switching circuit is coupled to the first power terminal of the switching transistor, the third pull-up switching circuit being configured to conduct current between the first and second power terminals of the third pull-up switching circuit responsive to the programming voltage. In a fourth pull-up switching circuit of the voltage detecting circuit, the first power terminal of the fourth pull-up switching circuit is coupled to the second power terminal of the second pull-up switching circuit, the control terminal of the fourth pull-up switching circuit is coupled to the programming voltage terminal, and the second power terminal of the fourth pull-up switching circuit is coupled to the first power terminal of the third pull-up switching circuit, the fourth pull-up switching circuit being configured to conduct current between the first and second power terminals of the fourth pull-up switching circuit responsive to the programming voltage. There is also a first pull-down switching circuit of the voltage detecting circuit, wherein the first power terminal of the first pull-down switching circuit is coupled to the second power terminal of the switching transistor, and wherein the control terminal of the first pull-down switching circuit is coupled to the mode control terminal, the first pull-down switching circuit being configured to conduct current between the first and second power terminals of the first pull-down switching circuit responsive to the first logic state of the mode control signal, and a second pull-down switching circuit, wherein the first power terminal of the second pull-down switching circuit is coupled to the second power terminal of the switching transistor, and wherein the control terminal of the second pull-down switching circuit is coupled to the mode control terminal, the second pull-down switching circuit being configured to conduct current between the first and second power terminals of the second pull-down switching circuit responsive to the second logic state of the mode control signal, and a third pull-down switching circuit, wherein the first power terminal of the third pull-down switching circuit is coupled to the second power terminal of the first pull-down switching circuit, the control terminal of the third pull-down switching circuit is coupled to the programming voltage terminal, and the second power terminal of the third pull-down switching circuit is coupled to the second power terminal of the switching transistor, the third pull-down switching circuit being configured to conduct current between the first and second power terminals of the third pull-down switching circuit responsive to the programming voltage, and a fourth pull-down switching circuit, wherein the first power terminal of the fourth pull-down switching circuit is coupled to the second power terminal of the second pull-down switching circuit, the control terminal of the fourth pull-down switching circuit is coupled to the programming voltage terminal, and the second power terminal of the fourth pull-down switching circuit is coupled to the first power terminal of the third pull-down switching circuit, the fourth pull-down switching circuit being configured to conduct current between the first and second power terminals of the fourth pull-down switching circuit responsive to the programming voltage.

An embodiment of the method of the present invention for controlling power consumption in a voltage detection circuit having a normal operation mode and an active power down mode includes shortening an effective channel length of the voltage detection circuit during the normal operation mode, lengthening the effective channel length of the voltage detection circuit during the active power down mode.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 3:
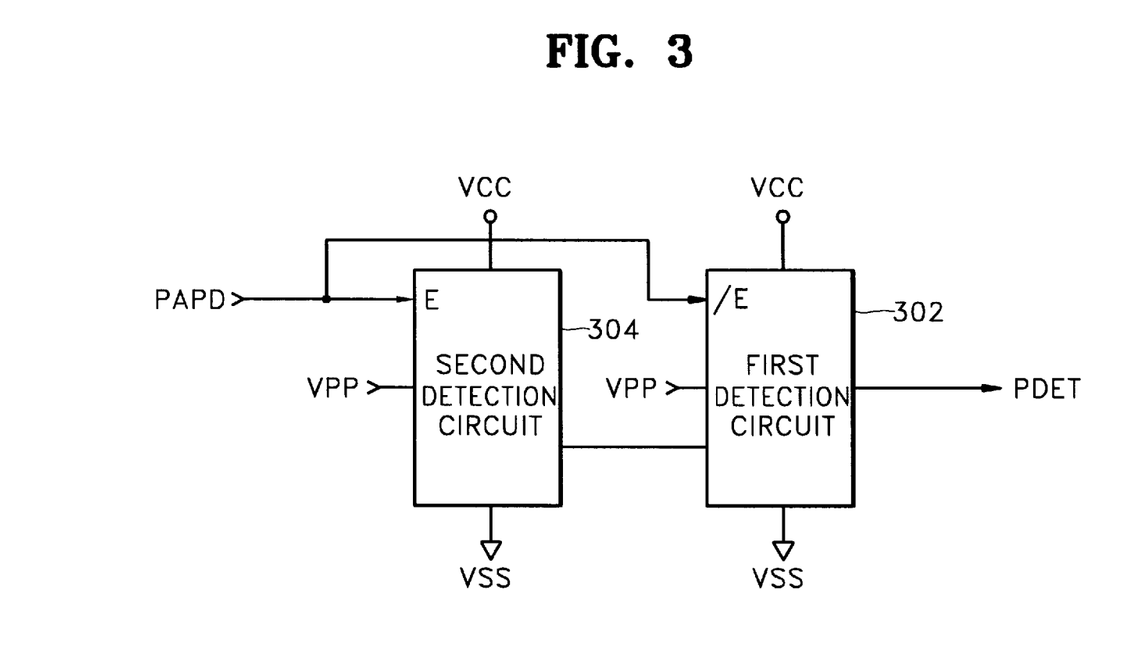
FIG. 3 is a circuit diagram of a voltage detecting circuit according to an embodiment of the present invention.

Referring to FIG. 3, an embodiment of a voltage detecting circuit according to the present invention is composed of a first detecting circuit 302 and a second detecting circuit 304. The first detecting circuit 302 is activated in the case where mode control signal PAPD is at a low level, and the second detecting circuit 304 is activated in the case where mode control signal PAPD is at a high level. Mode control signal PAPD is at a low level in the case of a normal operation mode, and a high level in the case of an active power down mode. The mode control signal PAPD, as shown in FIG. 1, is generated by delaying a clock enable signal (CKE) externally applied to a semiconductor memory device which includes the first and second detecting circuits 302 and 304.

The first and second detecting circuits 302 and 304 generate output signal PDET according to a level of a voltage to be detected, such as a boosted programming voltage VPP. That is, if the level of the boosted voltage VPP is at a predetermined level or below, then the output PDET is at a logic low level, and if not, then the output PDET is at a logic high level.

In the present invention, a current path of the first detecting circuit 302 is shorter than that of the second detecting circuit 304. That is, an effective channel length of the first detecting circuit 302 is shorter than that of the second detecting circuit 304. Therefore, the resistance of the second detecting circuit 304 is higher than that of the first detecting circuit 302. Thus, when first detecting circuit 302 is activated, the PDET signal will reach a valid state more quickly. However, when just the second detecting circuit 304 is active, the current consumed is less than when first detecting circuit 302 is active.

Figure 4:
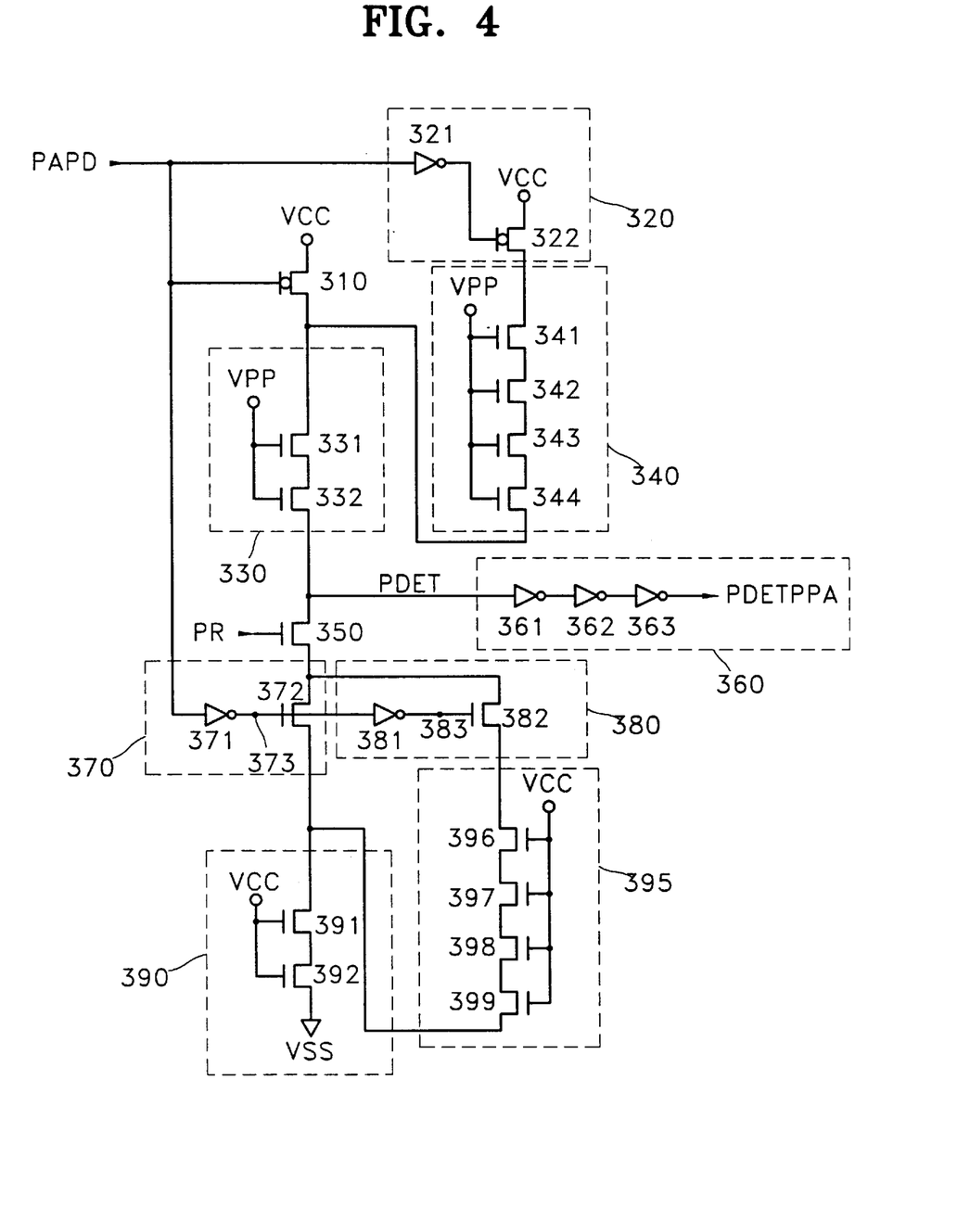
FIG. 4 is a circuit diagram of a voltage detecting circuit according to another embodiment of the present invention.

FIG. 4 is a more detailed diagram of one embodiment of the voltage detecting circuit of FIG. 3, wherein the voltage detecting circuit includes pull-up switching portions 310, 320, 330, 340, a switching transistor 350, a driving portion 360, and first pull-down switching portions 370, 380, 390 and 395. In FIG. 4, the first detecting circuit 302 is composed of pull-up switching portions 310 and 330, switching transistor 350, and pull-down switching portions 370 and 390. The second detecting circuit 304 is composed of pull-up switching portions 320, 340 and 310, switching transistor 350, and pull-down switching portions 380, 395 and 390.

The pull-up switching portion 310 includes a PMOS transistor wherein PAPD (see FIG. 1) is applied to the gate, and the drain is connected to a power supply voltage VCC, and the source is connected to pull-up portion 330. Pull-up switching portion 320 includes an inverter 321 for inverting PAPD, and the gate of PMOS transistor 322 receives the output of the inverter 321. Accordingly, pull-up switching portions 310 and 320 are selectively turned-on by the mode control signal PAPD.

To describe the function of the circuit of FIG. 4 in further detail, when the mode control signal PAPD is at a low level, i.e. a normal operation mode, pull-up switching portion 310 is switched on and the pull-up switching portion 320 is switched off thereby activating only pull-up portion 330. In contrast, when mode control signal PAPD is at a high level, i.e. an active power down mode, pull-up switching portion 310 is switched off and the second pull-up switching portion 320 is switched on. Therefore, power supply voltage VCC is supplied to pull-up portions 340 and 330 through pull-up switching portion 320 and portions 330 and 340 are activated.

Pull-up portion 330 includes NMOS transistors 331 and 332, and each NMOS transistor receives VPP at its gate terminal. Pull-up portion 340 includes NMOS transistors 341, 342, 343 and 344 which each receive VPP through their respective gate terminals.

Pull-down switching portion 370 includes an inverter 371 for inverting the PAPD signal and an NMOS transistor 372 having a gate connected to the output of inverter 371.

Pull-down switching portion 380 includes an inverter 381 for inverting the output of the inverter 371 and an NMOS transistor 382 having a gate connected to the output of inverter 381. Accordingly, pull-down switching portions 370 and 380 are selectively turned-on as determined by the PAPD signal. To further elaborate, when mode control signal PAPD is at a low level, i.e. normal operation mode, pull-down switching portion 370 is on and pull-down switching portion 380 is off thereby activating only pull-down portion 390. In contrast, when mode control signal PAPD is at a high level, i.e. active power down mode, pull-down switching portion 370 is off and pull-down switching portion 380 is on thereby activating the pull-down portions 390 and 395.

Pull-down portion 390 includes NMOS transistors 391 and 392, and pull-down portion 395 includes NMOS transistors 396, 397, 398 and 399. The driving portion 360 includes inverters 361, 362 and 363.

Before explaining the operation of the voltage detecting circuit above in greater detail, the current consumption of the circuit, which varies depending upon the operation mode, is described below.

The current in a transistor when it operates in its linear operation region can be expressed as follows:

$$i_D = \frac{\mu_0 C_{ox} W}{L} [(V_{gs} - V_t) - V_{ds}/2] V_{ds}(1 + \lambda V_{ds}),$$ (Formula 1)

$$0 < V_{ds} \leq (V_{gs} - V_t)$$

Where $i_D$ represents the surface mobility for the channel of either an NMOS transistor or a PMOS transistor, $C_{ox}$ represents capacitance per unit area of gate oxide, W represents an effective channel width of the transistor, L represents an effective channel length of the transistor, $V_{gs}$ represents the gate to source voltage, $V_{ds}$ represents the drain to source voltage, $V_t$ represents the threshold voltage and $\lambda$ represents the channel length modulation parameter.

Meanwhile, the current in a transistor operating in its saturation region can be expressed as follows:

$$i_D = \frac{\mu_0 C_{ox} W}{2L} (V_{gs} - V_t)^2 (1 + \lambda V_{ds}),$$ (Formula 2)

$$0 < (V_{gs} - Vt) \leq V_{ds}$$

As shown in Formulas 1 and 2, the current flowing in a transistor is smaller when the effective channel length of the transistor is longer. Conversely, the current is larger when the effect channel length of the transistor is short.

In FIG. 4, the level of voltage VPP applied to each gate of transistors 331, 332, 341, 342, 343 and 344 of pull-up portions 330 and 340, is higher than that of the power supply voltage VCC applied to the drains thereof. Accordingly, the transistors 331, 331, 341, 342, 343 and 344 operate in their linear region, so that the current flows according to Formula 1. Each transistor 391, 392, 396, 397, 398 and 399 of pull-down portions 390 and 395 operates in its saturation region, so that the current flows according to Formula 2. In normal operation mode, which requires high speed operation, the effective channel length of the voltage detection circuit is shortened and a larger current flows. By contrast, in active power down mode, the effective channel length is of the voltage detection circuit lengthened to reduce power consumption of its voltage detection circuit.

In order to shorten the effective channel length of the voltage detection circuit when the mode control signal PAPD is active, pull-up switching portion 310 and pull-down switching portion 370 are turned-on and pull-up switching portion 320 and pull-down switching portion 380 are turned-off. Thus, a current path is formed by pull-up portions 310 and 330, switching transistor 350 and pull-down portions 370 and 390. The effective channel length is thereby shortened to enable high speed operation. When mode control signal PAPD is inactive, pull-up switching portion 320 and pull-down switching portion 380 are turned-on and pull-up switching portion 310 and pull-down switching portion 370 are turned-off. Thus, a current path is formed by pull-up portions 320 and 340, switching transistor 350 and pulldown portions 380, 395 and 390 which are all connected in series. The increased effective channel length therefore reduces the current flow and power consumption.

The voltage which is being detected in the present invention, VPP, may be used for driving a wordline of a semiconductor memory device and should have a magnitude of at least VCC+Vt. The logic state of the output signal PDET is determined by the level of VPP.

In normal operation mode, the mode control signal PAPD is at a low level to switch on PMOS transistor 310 and NMOS transistor 372 and switch off PMOS transistor 322 and NMOS transistor 382. Accordingly, the detection operation is performed by first detecting circuit 302 composed of pull-up switching portions 310 and 330, switching transistor 350, pull-down switching portions 370 and 390. A row active signal PR, which is generated based upon activation of a low address strobe signal (/RAS) externally applied to the semiconductor memory device, is at a high level during a row active period. Accordingly, in the case of normal operation mode and a row active period, current flows through PMOS transistor 310, and NMOS transistors 331, 332, 350, 372, 391 and 392. The voltage level of output signal PDET can be expressed as follows:

$$V_{PDET} = \frac{(R_{ON\text{-}350} + R_{ON\text{-}372} + R_{ON\text{-}391} + R_{ON\text{-}392})}{R_{ON\text{-}310} + R_{ON\text{-}331} + R_{ON\text{-}332} + R_{ON\text{-}350} + R_{ON\text{-}372} + R_{ON\text{-}391} + R_{ON\text{-}392}} \quad \text{(Formula 3)}$$

Where $V_{PDET}$ represents the voltage of signal PDET, $R_{ON\text{-}310}$, $R_{ON\text{-}331}$, $R_{ON\text{-}332}$, $R_{ON\text{-}372}$, $R_{ON\text{-}391}$, and $R_{ON\text{-}392}$ represent the active resistance of transistors 310, 331, 332, 350, 372, 391 and 392, respectively. The active resistance of NMOS transistors 331 and 332 varies according to the level of VPP, while the active resistance of the other transistors remain at a constant level. Accordingly, the voltage level of PDET is a logic low level when VPP is lower than a predetermined target level (i.e. VCC+Vt), and PDET outputs a logic high level when VPP is higher than the predetermined target level.

Meanwhile, in the active power down mode, mode control signal PAPD is at a high level to switch off PMOS transistor 310 and NMO S transistor 372 and switch on PMOS transistor 322 and NMOS transistor 382. Accordingly, the detection operation is performed by the second detecting circuit 304 composed of pull-up switching portions 320, 330 and 340, switching transistor 350, and pull-down switching portions 380, 395 and 390. As the level of VPP varies, the active resistance values of NMOS transistors 341, 342, 343, 344, 331 and 332 of pull-up portion 340 and 330 will correspondingly vary. Accordingly, the signal PDET outputs a logic low level when VPP is lower than the predetermined target level, and PDET outputs a logic high level when VPP is higher than the predetermined target level.

The driving portion 360, which is composed of inverters 361, 362 and 363, buffers output signal PDET to generate a boosted programming voltage detecting signal 'PDETPPA'. If VPP is at the predetermined target level or below, then PDETPPA will output a logic high level, and will output a logic low level otherwise.

Figure 5:
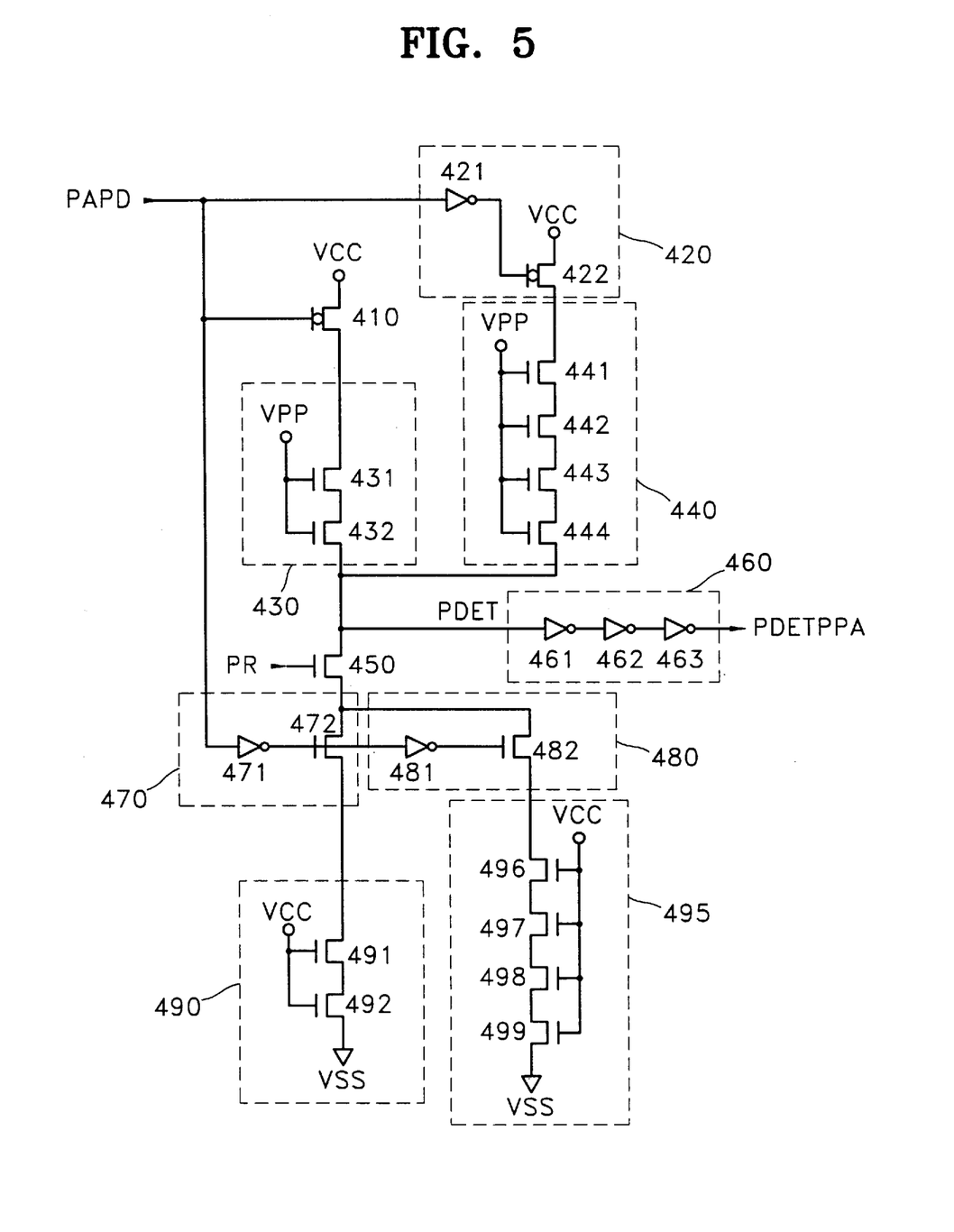
FIG. 5 is a circuit diagram of a voltage detecting circuit according to still another embodiment of the present invention.

Referring to FIG. 5, another embodiment of a voltage detecting circuit according to the present invention includes pull-up switching portions 410, 420, 430 and 440, switching transistor 450, driving portion 460, and pull-down switching portions 470, 480, 490 and 495. In FIG. 5, the first detecting circuit 302 is composed of a pull-up switching portions 310 and 330, switching transistor 350, pull-down switching portions 370 and 390. The second detecting circuit 304 is composed of pull-up portion 320 and 340, switching transistor 350, pull-down switching portions 380 and 395.

In the voltage detecting circuit of FIG. 5, unlike the circuit of FIG. 4, pull-up portions 430 and 440 are connected in parallel and selectively activated by PAPD. Also, pull-down portions 490 and 495 are connected in parallel and selectively activated by PAPD. That is, when PAPD is active, the gate of PMOS transistor 422 of pull-up switching portion 420 receives an inverted PAPD output from inverter 421, and transistor 422 is turned on. Also, the gate of NMOS transistor 482 of pull-down switching portion 480 receives PAPD through inverters 471 and 481 and is turned-on. Therefore, pull-up portion 440 and pull-down portion 495 are activated.

However, when PAPD is inactive, the gate of PMOS transistor of the pull-up portion 410 receives PAPD and is turned-on. The gate of NMOS transistor 472 receives the inverted PAPD output from inverter 471 and is turned-on. Thus, pull-up portion 430 and pull-down portion 490 are activated.

As a result, the effective channel length of the current path formed by the pull-up portion 440 and pull-down portion 495, which are activated in the active power down mode, is longer than that formed by pull-up portion 430 and pull-down portion 490, which are activated in case of the normal operation mode. Therefore, the power consumption in the active power mode is reduced from that of the normal operation mode because the longer channel length increases resistance and reduces the current flow.

In the voltage detecting circuit of FIG. 5, switching transistor 450 is turned-on when the PR signal is at a "high" level and turned-off when the PR signal is at a "low" level. Thus, the PR signal acts as an enable signal for the voltage detecting circuit. When the PR signal is at a "high" level, the voltage level of output signal PDET varies according to the level of VPP applied to the gate of each of the transistors 431, 432, 441, 442, 443 and 444 which form pull-up portions 430 and 440. The logic of PDET is inverted and delayed by driving portion 460 which produces the programming voltage detecting signal PDETPPA.

The voltage detecting circuit according to the present invention includes a plurality of pull-up portions and pull-down portions which are selectively activated by the mode control signal PAPD. In the present voltage detecting circuit, the current path is shortened during normal operation mode to enable high speed operation and lengthened during active power down mode to obtain a higher effective resistance to reduce current flow thereby to reduce power consumption.

Having illustrated and described the principles of the present invention in the context of the embodiments above, it should be readily apparent to those skilled in the art that the invention can be modified in arrangment and detail without departing from such principles. For example, while the invention above is described in the context of a circuit for detecting a level of a programming voltage, it should be readily understood that the same principles may be applied to reducing power consumption in other voltage detection circuits without departing from the scope and spirit of the present invention.

I claim:

1. A voltage detecting circuit comprising:
   an output terminal for producing a detection signal;
   a first detection circuit portion, coupled to the output terminal, for performing a detection operation of an input voltage level, and being activated in a normal operation mode; and
   a second detection circuit portion, coupled to the first detection circuit portion, for performing the detection operation of the voltage level and being activated in an active power down mode,
   wherein an effective channel length of said second detection circuit portion is longer than that of said first detection circuit portion.

2. A voltage detecting circuit according to claim 1, wherein said first detection circuit portion comprises:
   a first pull-up portion, coupled to the output terminal, for performing a pull-up operation according to the voltage level to be detected;
   a second pull-up switching portion switched-on in the normal operation mode to provide a power supply to said first pull-up portion;
   a first pull-down portion for performing a pull-down operation; and
   a second pull-down switching portion switched-on in the normal operation mode to electrically couple said first pull-down portion with said output terminal,
   and wherein said second detection circuit portion comprises:

a third pull-up portion, coupled to a common node between the first pull-up portion and the section pull-up switching portion for performing pull-up operation according to the voltage level to be detected;

a fourth pull-up switching portion switched-on in the active power down mode to provide the power supply to said third pull-up portion;

a third pull-down portion for performing the pull-down operation; and a fourth pull-down switching portion switched-on in the active power down mode to electrically couple said third pull-down portion with said output terminal.

3. A voltage detecting circuit according to claim 2, further comprising a switching transistor coupled between said a common node between output terminal and said second pull-down switching portion and said fourth pull-down switching portion, said switching transistor is configured to be switched-on during a period of memory cell access.

4. A voltage detecting portion according to claim 2, further comprising a driving portion coupled to said output terminal and which buffers the detection signal.

5. A voltage detecting circuit comprising:

an output terminal for producing a detection signal;

a first pull-up switching portion switched-on in a normal operation mode;

a second pull-up switching portion switched-on in an active power down mode;

a third pull-up portion coupled between said first pull-up switching portion and said output terminal and responsive to a voltage level to be detected;

a fourth pull-up portion coupled between said second pull-up switching portion and said third pull-up portion and responsive to a voltage level to be detected;

a first pull-down switching portion switched-on in the normal operation mode;

a second pull-down switching portion switched-on in the active power down mode;

a third pull-down portion coupled to said output terminal (PDET) through said first pull-down switching portion;

a fourth pull-down portion coupled between said second pull-down switching portion said third pull-down portion, wherein an effective channel length of the active power down mode is longer than that of the normal operation mode.

6. A voltage detecting circuit according to claim 5, further comprising a switching transistor coupled between said output terminal and a common node between said first pull-down switching portion and said output terminal and said second pull-down switching portion wherein the switching transistor is configured switched-on during a period of memory cell access.

7. A voltage detecting circuit according to claim 5, further comprising a driving portion coupled to said output terminal, wherein said driving portion buffers the detection signal.

8. A voltage detecting circuit having a normal operation mode and an active power down mode, the circuit comprising:

a first power supply terminal configured to receive a first power supply voltage;

a second power supply terminal configured to receive a second power supply voltage;

a programming voltage terminal configured to receive a programming voltage;

a mode control terminal configured to receive a mode control signal;

a program ready terminal configured to receive a program ready signal;

an output terminal configured to output a voltage detect signal;

a switching transistor having first and second power terminals and a control terminal, wherein the control terminal of the switching transistor is coupled to the program ready terminal, and wherein the first power terminal of the switching transistor is coupled to the output terminal;

a first pull-up switching circuit having a control terminal and first and second power terminals, wherein the first power terminal of the first pull-up switching circuit is coupled to the first power supply terminal, and wherein the control terminal of the first pull-up switching circuit is coupled to the mode control terminal, the first pull-up switching circuit being configured to conduct current between the first and second power terminals of the first pull-up switching circuit responsive to a first logic state of the mode control signal corresponding to the normal operation mode;

a second pull-up switching circuit having a control terminal and first and second power terminals, wherein the first power terminal of the second pull-up switching circuit is coupled to the first power supply terminal, and wherein the control terminal of the second pull-up switching circuit is coupled to the mode control terminal, the second pull-up switching circuit being configured to conduct current between the first and second power terminals of the second pull-up switching circuit responsive to a second logic state of the mode control signal corresponding to the active power down mode;

a third pull-up switching circuit having a control terminal and first and second power terminals, wherein the first power terminal of the third pull-up switching circuit is coupled to the second power terminal of the first pull-up switching circuit, and wherein the control terminal of the third pull-up switching circuit is coupled to the programming voltage terminal, and further wherein the second power terminal of the third pull-up switching circuit is coupled to the first power terminal of the switching transistor, the third pull-up switching circuit being configured to conduct current between the first and second power terminals of the third pull-up switching circuit responsive to the programming voltage;

a fourth pull-up switching circuit having a control terminal and first and second power terminals, wherein the first power terminal of the fourth pull-up switching circuit is coupled to the second power terminal of the second pull-up switching circuit, and wherein the control terminal of the fourth pull-up switching circuit is coupled to the programming voltage terminal, and further wherein the second power terminal of the fourth pull-up switching circuit is coupled to the first power terminal of the third pull-up switching circuit, the fourth pull-up switching circuit being configured to conduct current between the first and second power terminals of the fourth pull-up switching circuit responsive to the programming voltage;

a first pull-down switching circuit having a control terminal and first and second power terminals, wherein the first power terminal of the first pull-down switching circuit is coupled to the second power terminal of the switching transistor, and wherein the control terminal of the first pull-down switching circuit is coupled to the mode control terminal, the first pull-down switching circuit being configured to conduct current between the first and second power terminals of the first pull-down switching circuit responsive to the first logic state of the mode control signal;

a second pull-down switching circuit having a control terminal and first and second power terminals, wherein the first power terminal of the second pull-down switching circuit is coupled to the second power terminal of the switching transistor, and wherein the control terminal of the second pull-down switching circuit is coupled to the mode control terminal, the second pull-down switching circuit being configured to conduct current between the first and second power terminals of the second pull-down switching circuit responsive to the second logic state of the mode control signal;

a third pull-down switching circuit having a control terminal and first and second power terminals, wherein the first power terminal of the third pull-down switching circuit is coupled to the second power terminal of the first pull-down switching circuit, and wherein the control terminal of the third pull-down switching circuit is coupled to the programming voltage terminal, and further wherein the second power terminal of the third pull-down switching circuit is coupled to the second power terminal of the switching transistor, the third pull-down switching circuit being configured to conduct current between the first and second power terminals of the third pull-down switching circuit responsive to the programming voltage; and a fourth pull-down switching circuit having a control terminal and first and second power terminals, wherein the first power terminal of the fourth pull-down switching circuit is coupled to the second power terminal of the second pull-down switching circuit, and wherein the control terminal of the fourth pull-down switching circuit is coupled to the programming voltage terminal, and further wherein the second power terminal of the fourth pull-down switching circuit is coupled to the first power terminal of the third pull-down switching circuit, the fourth pull-down switching circuit being configured to conduct current between the first and second power terminals of the fourth pull-down switching circuit responsive to the programming voltage.

9. The voltage detecting circuit of claim 8, wherein:

the third pull-up circuit includes a first plurality of transistors, each one of the first plurality of transistors having gate, drain and source terminals, the first plurality of transistors being connected in series between the first and second power terminals of the third pull-up circuit, wherein the gates of the first plurality of transistors are coupled to the control terminal of the third pull-up circuit;

the fourth pull-up circuit includes a second plurality of transistors, each one of the second plurality of transistors having gate, drain and source terminals, the second plurality of transistors being connected in series between the first and second power terminals of the fourth pull-up circuit, wherein the gates of the second plurality of transistors are coupled to the control terminal of the fourth pull-up circuit;

the third pull-down circuit includes a third plurality of transistors, each one of the third plurality of transistors having gate, drain and source terminals, the third plurality of transistors being connected in series between the first and second power terminals of the third pull-down circuit, wherein the gates of the third plurality of transistors are coupled to the control terminal of the third pull-down circuit; and the fourth pull-down circuit includes a fourth plurality of transistors, each one of the fourth plurality of transistors having gate, drain and source terminals, the fourth plurality of transistors being connected in series between the first and second power terminals of the fourth pull-down circuit, wherein the gates of the fourth plurality of transistors are coupled to the control terminal of the fourth pull-down circuit.

10. The voltage detecting circuit of claim 9 wherein:

the first pull-up switching circuit includes a first PMOS transistor having gate, drain and source terminals, the gate terminal of the first PMOS transistor being coupled to the control terminal of the first pull-up switching circuit, the drain terminal of the first PMOS transistor being coupled to the first power terminal of the first pull-up switching circuit, and the source terminal of the first PMOS transistor being coupled to the second power terminal of the first pull-up switching circuit;

the second pull-up switching circuit includes a first inverter and a second PMOS transistor having gate, drain and source terminals, the first inverter being coupled between the gate terminal of the second PMOS transistor being and the control terminal of the second pull-up switching circuit, the drain terminal of the second PMOS transistor being coupled to the first power terminal of the second pull-up switching circuit, and the source terminal of the second PMOS transistor being coupled to the second power terminal of the second pull-up switching circuit;

the first pull-down switching circuit includes a first NMOS transistor having gate, drain and source terminals, the gate terminal of the first NMOS transistor being coupled to the control terminal of the first pull-down switching circuit, the drain terminal of the first NMOS transistor being coupled to the first power terminal of the first pull-down switching circuit, and the source terminal of the first NMOS transistor being coupled to the second power terminal of the first pull-down switching circuit;

the second pull-down switching circuit includes a second inverter and a second PMOS transistor having gate, drain and source terminals, the second inverter being coupled between the gate terminal of the second PMOS transistor being and the control terminal of the second pull-down switching circuit, the drain terminal of the second PMOS transistor being coupled to the first power terminal of the second pull-down switching circuit, and the source terminal of the second PMOS transistor being coupled to the second power terminal of the second pull-down switching circuit;

the switching transistor being a third NMOS transistor; and the first, second, third and fourth pluralities of transistors each being comprised of series connected NMOS transistors.

11. The voltage detecting circuit of claim 8 including a buffer circuit coupled between the output terminal and the first power terminal of the switching transistor.

12. The voltage detecting circuit according to claim 11, wherein the buffer circuit includes a plurality of inverters.

13. A method for controlling power consumption in a semiconductor circuit having a normal operation mode and an active power down mode, the method comprising the steps:

shortening an effective channel length of the semiconductor circuit during the normal operation mode; and lengthening the effective channel length of the semiconductor circuit during the active power down mode.

14. The method of claim 13 including the steps:

coupling a first pull-up switching circuit, a third pull-up switching circuit, a first pull-down switching circuit and a third pull-down switching circuit in series to form a first current path through the semiconductor circuit; and coupling a second pull-up switching circuit, a fourth pull-up switching circuit, the third pull-up switching circuit, a second pull-down switching circuit, a fourth pull-down switching circuit and the third pull-down switching circuit in series to form a second current path through the semiconductor circuit; and wherein the step of shortening an effective channel length of the semiconductor circuit includes:

activating the first pull-up switching circuit and the first pull-down switching circuit responsive to the normal operation mode, and de-activating the second pull-up switching circuit and the second pull-down switching circuit responsive to the normal operation mode; and wherein the step of lengthening the effective channel length of the semiconductor circuit includes:

de-activating the first pull-up switching circuit and the first pull-down switching circuit responsive to the active power down mode, and activating the second pull-up switching circuit and the second pull-down switching circuit responsive to the active power down mode.

15. The method of claim 13 including the steps:

coupling a first pull-up switching circuit, a third pull-up switching circuit, a first pull-down switching circuit and a third pull-down switching circuit in series to form a first current path through the semiconductor circuit; and coupling a second pull-up switching circuit, a fourth pull-up switching circuit, a second pull-down switching circuit, and a fourth pull-down switching circuit in series to form a second current path through the semiconductor circuit, the fourth pull-up switching circuit having a channel length that is longer than a channel length of the third pull-up circuit, and the fourth pull-down switching circuit having a channel length that is longer than a channel length of the third pull-down switching circuit; and wherein the step of shortening an effective channel length of the semiconductor circuit includes:

activating the first pull-up switching circuit and the first pull-down switching circuit responsive to the normal operation mode, and de-activating the second pull-up switching circuit and the second pull-down switching circuit responsive to the normal operation mode; and wherein the step of lengthening the effective channel length of the semiconductor circuit includes:

de-activating the first pull-up switching circuit and the first pull-down switching circuit responsive to the active power down mode, and activating the second pull-up switching circuit and the second pull-down switching circuit responsive to the active power down mode.

* * * * *